United States Patent [19]

Lin et al.

[11] Patent Number: 5,071,520

[45] Date of Patent: Dec. 10, 1991

[54] METHOD OF TREATING METAL FOIL TO IMPROVE PEEL STRENGTH

[75] Inventors: Lifun Lin, New Haven; Paul Menkin, Branford, both of Conn.

[73] Assignee: Olin Corporation, Cheshire, Conn.

[21] Appl. No.: 428,683

[22] Filed: Oct. 30, 1989

[51] Int. Cl.$^5$ ................................................ C25D 5/48
[52] U.S. Cl. ................................... 205/155; 205/197
[58] Field of Search .............................. 204/27, 35.1

[56] References Cited

U.S. PATENT DOCUMENTS

| | | | |
|---|---|---|---|
| 2,030,601 | 2/1936 | McDonald | 148/6.5 |
| 2,412,543 | 12/1946 | Tanner | 204/35 |
| 2,418,608 | 4/1947 | Thompson et al. | 148/6 |
| 2,647,865 | 8/1953 | Freud | 204/33 |
| 3,625,844 | 12/1971 | McKean | 204/140 |
| 3,677,828 | 7/1972 | Caule | 148/6.15 R |
| 3,716,427 | 2/1973 | Caule | 156/3 |
| 3,764,400 | 10/1973 | Caule | 148/6.16 |
| 3,853,716 | 12/1974 | Yates et al. | 204/28 |
| 4,131,517 | 12/1978 | Mitsuo et al. | 204/27 |
| 4,387,006 | 6/1983 | Kajiwara et al. | 204/32 R |
| 4,432,846 | 2/1984 | Honeycutt | 204/129.95 |
| 4,468,293 | 8/1984 | Polan et al. | 204/27 |
| 4,515,671 | 5/1985 | Polan et al. | 204/228 |
| 4,549,950 | 10/1985 | Polan et al. | 204/206 |
| 4,647,315 | 3/1987 | Parthasarathi et al. | 148/6.16 |
| 4,952,285 | 8/1990 | Lin | 204/27 |

FOREIGN PATENT DOCUMENTS

| | | |
|---|---|---|
| 87324 | 5/1982 | Japan . |
| 25297 | 2/1984 | Japan . |
| 15654 | 1/1985 | Japan . |
| A2030176 | 7/1978 | United Kingdom . |
| A2073779 | 4/1980 | United Kingdom . |

OTHER PUBLICATIONS

Berger, S. E. and H. E. Petty, "Organofunctional Silanes", *Handbook of Fillers for Plastics*, Section II, Coupling Agents, Chapter 3, pp. 65–69, 1987.

*Primary Examiner*—T. M. Tufariello
*Attorney, Agent, or Firm*—H. Samuel Kieser.

[57] ABSTRACT

A technique for improving the peel strength of copper and copper based alloy materials, and particularly for copper or copper based alloy materials which may be wrought or electrolytically deposited copper foil having an antitarnish treatment applied thereto, preferably by the use of a chromate-containing solution. The material is subjected to a rinse containing a silane coupling agent, which preferably is an organofunctional silane, and more preferably is an alkoxysilane derivative. Both the original peel strength and the peel strength after storage of the material so treated is enhanced.

19 Claims, No Drawings

METHOD OF TREATING METAL FOIL TO IMPROVE PEEL STRENGTH

The present invention broadly relates to a method for treating copper and copper base alloy materials to increase its peel strength upon lamination with another material. More particularly, the invention relates to a method of treating metal foil and particularly copper and copper base foils having an antitarnish coating thereon to improve its peel strength.

Copper and copper base alloy foils are widely used in the printed circuit board industry. The foil is produced to a thickness of under 0.006 inches and more generally to a thickness in the range of from about 0.0002 inches (known in the art as ⅛ ounce foil). The foil is produced by one of two means. "Wrought"0 foil is produced by mechanically reducing the thickness of a copper or copper alloy strip by a process such as rolling. "Electrodeposited" foil is produced by electrolytically depositing copper ions on a rotating cathode drum and then peeling the deposited strip from the cathode.

The foil is then bonded to a dielectric support layer forming a printed circuit board. The dielectric support layer is typically a fiberglass reinforced expoxy such as FR-4 (a fire retardant epoxy) or a polyimide such as Kapton manufactured by DuPont. The copper foil layer is laminated to the dielectric carrier layer. Lamination comprises bonding the copper foil layer to the dielectric carrier layer through the use of heat and pressure. A pressure of about 300 psi, at a temperature at about 175° C. for a time of up to 30 minutes will provide suitable adhesion between the layers.

To maximize adhesion, it is desirable to roughen the surface of the foil which contacts the dielectric prior to bonding. While there are a variety of techniques available to roughen or treat the foil, one exemplary technique involves the formation of a plurality of copper or copper oxide dendrites on the foil surface. U.S. Pat. Nos. 4,468,293 and 4,515,671, both to Polan et al. disclose this treatment. The process produces COPPERBOND TM foil (COPPERBOND TM is a trademark of Olin Corporation, Stamford, Ct). In some instances, at least one side of the foil, particularly the roughened side bearing the dendrites may have an eletrodeposited coating of zinc or brass applied thereto. This coating has been found to enhance the bond strength of the foil with the substrate.

One problem facing printed circuit board manufacturers using either electrolytic or wrought copper foils is the relative reactivity of the copper. Copper readily stains and tarnishes. Tarnishing may occur during room temperature storage of the foil or during elevated temperature lamination. The stains and tarnish are aesthetically unpleasant and may be a source of problems during the manufacture of the printed circuit board. For example, staining of copper foil prior to lamination can affect both the bond strength between the foil and the dielectric substrate and the etching characteristics of the resultant laminate.

In the past, stain resistance has been imparted to copper and copper base alloy materials by immersion in an electrolyte containing chromate ions U.S. Pat. No. 3,625,844 to McKean, describes a method of stainproofing copper foil involving the electrolytic treatment of the foil in a aqueous electrolyte under critical conditions of hexavalent chromium ion concentration, cathode current density, and treatment time.

U.S. Pat. No. 3,853,716 to Yates et al., discusses the McKean process and points out that it is not a completely satisfactory stain-proofing technique, due to a build-up of copper and chromium cations in the electrolyte bath. The cations interfere with the effectiveness of the stain proofing. Yates et al. attempt to overcome this problem by rendering the copper material cathodic as it passes through an aqueous electrolyte containing hexavalent chromium ion containing anions and being of sufficient alkalinity to cause precipitation of copper and chromium cations.

U.S. Pat. Nos. 4,131,517 to Mitsuo et al., and 4,387,006 to Kajiwara et al., illustrate still other chromate containing treatments for suppressing time dependent changes in color tone during storage. Still other stain proofing techniques are illustrated in United Kingdom published patent applications 2,030,176A and 2,073,779A.

Solutions of phosphoric acid, chromic acid and/or their salts have also been applied to various materials in an attempt to impart tarnish and corrosion resistance. U.S. Pat. Nos. 3,677,828, 3,716,427, and 3,764,400, all to Caule, illustrate the use of phosphoric acid solutions to improve the tarnish resistance of copper and copper-based alloys. Caule also describes in his '400 patent the use of a caustic rinse solution after application of his phosphoric acid treatment. U.S. Pat. No. 4,647,315 to Parthasarathi et al., discloses a dilute aqueous chromic acid-phosphoric acid solution.

Phosphoric and/or chromic acid solutions have also been applied to zinc, zinc-coated articles, and aluminum foil and articles. U.S. Pat. Nos. 2,030,601 to McDonald, 2,412,532 to Tanner, 2,418,608 to Thompson et al., 2,647,865 to Freud and 4,432,846 to Honnycutt, III, illustrate some of the applications of phosphoric-chromic acid solution.

In the manufacture of foil, especially for electronic applications, one of the important criteria is that the foil have good peel strength after being laminated to the substrate such as a fiberglass or reinforced epoxy. As mentioned above, the copper foil may be provided with a plurality of dendrites and also plated with a zinc coating to increase the peel strength. Additionally, as also mentioned above, it is necessary that the foil be subjected to an antitarnish treatment. In an attempt to increase the peel strength on the foil, various improved antitarnish solutions have been tried including the use of a mixture of chromic acid/sulfuric acid rather than the chromic acid/phosphoric acid solution described in the above-mentioned U.S. Pat. No. 4,647,315. In the case of the chromic acid/sulfuric acid treatment, the initial peel strength of the foil was increased on the order of two pounds per inch over that of the chromic acid/phosphoric acid treated foil. However, even with the improved antitarnish treatment, the peel strength of the foil tends to decay after storage. As a result, such foil, if not immediately used, will not Provide a satisfactory bond with the substrate, and hence may be unusable for its intended purpose.

Accordingly, it is an object of the present invention to provide an improvement in the treatment of foil to provide improved peel strength.

It is a specific object of the present invention to provide a treatment to be applied after the antitarnish treatment of foil which will result in increased peel strength and a minimization of decay of the peel strength after storage.

In accordance with the present invention, the metal is subjected to a rinse in an aqueous solution containing an effective amount of a silane coupling agent.

The above objects, features, and advantages of the present invention will become more apparent by reference to the following detailed description.

The present invention is applicable to metal foils and particularly to such metal foils that ar subjected to an anti-tarnish treatment.

More specifically, the present invention in its preferred form relates to an improved treatment for providing copper and copper alloy foil materials which have been provided with an antitarnish coating. As used here in the term copper and copper alloy foil includes copper and copper base alloy sheets, strips, foil, and slab materials. The copper foil to be treated may comprise any electrodeposited or wrought copper or copper alloy foil. When the foil is to be used for a printed circuit application, one surface of the foil may be treated to improve the adhesion properties of the foil. While any suitable treatment now in the art may be used to enhance the foil adhesion properties, it is preferred to electrolytically form a plurality of dendrites on the surface to be bonded to a substrate. Generally, the dendritic particles are formed in an electrolytic technique by immersing the copper or copper alloy foil in an aqueous electrolyte solution and applying a cathodic current to the foil. Prior to forming the dendrites, the copper or copper alloy foil may be cleaned and/or have a copper strike layer form thereon. The copper strike layer is applied where it is desirable to render the foil more electrochemically active and receptive to the subsequent roughening treatment U.S. Pat. Nos. 4,468,293 and 4,549,950, to Polan et al., which are hereby incorporated by reference herein in their entirety, illustrate suitable techniques for roughening the copper or copper alloy foil surface and to preparing the copper or copper alloy foil for use in printed circuit applications.

If desired, the foil, whether electrodeposited or wrought, may be rinsed and then subjected to a zinc plating treatment. This plating treatment may be used to apply a coating of zinc to the roughened or dendritic side of the foil. Such coating may be between 0.3 to about 3.0 g/m² and preferably between about 0.5 to about 2.0 g/m². The zinc plating may be applied utilizing a plating solution including a suitable form of zinc, probably in the form of zinc sulfate. The zinc sulfate may be dissolved in water to form an aqueous solution of from about 0.1M to about 1.5M. The current density applied to the side of the foil to be plated may be between about 5 to about 150 mA/cm² and preferably around 40 mA/cm².

After the zinc plating treatment, the foil may be rinsed at a suitable rinse station with deionized water. Such a rinse station may include a plurality of spray nozzles or, alternatively, comprise a tank containing the rinse solution through which the foil is passed or a combination of sprays and immersions. The foil, whether or not plated with zinc, can then be subjected to an antitarnish treatment.

The present invention is thought to be applicable to any antitarnish treatment applied to the foil, but it is considered particularly applicable to such antitarnish treatments involving the application of a chromate. One such antitarnish treatment may include the application of a dilute aqueous chromic acid-phosphoric acid solution to the material. This solution may have a concentration of chromic acid in the range of about 0.02 grams per liter to about 1 gram per liter and a concentration of phosphoric acid in the range of about 0.02 grams per liter to about 1 gram per liter. U.S. Pat. No. 4,647,315 provides additional details concerning this type of treatment.

Another suitable antitarnish treatment involves the application of a dilute aqueous chromic acid-sulfuric acid solution to the material. The solution may have a concentration of chromic acid in the range of about 0.02 g/l to about 5 g/l and a concentration of sulfuric acid in the range of about 0.02 g/l to about 20 g/l.

Yet another example of an antitarnish treatment which may be applied to the foil comprises electrolitically depositing chromium and zinc ions on the foil by immersion of the copper and copper-base foil in an aqueous electrolyte solution and applying a current density of from about one milliamp per square centimeter to about one amp per square centimeter to the foil, with the foil servicing as a cathode. The electrolyte solution may consist essentially of an hydroxide source, zinc ion source, and a water soluble hexavalent chromium. The hydroxide source is preferably sodium hydroxide or potassium hydroxide, most preferably sodium hydroxide (NaOH). The hexavalent chromium source may be any water soluble hexavalent chromium compound such as $Na_2CR_2O_7 \cdot 2H_2O$.

In the case of all the above-mentioned specific antitarnish treatments, the foil may be rinsed in a basic solution after the antitarnish treatment step. Such basic solutions may comprise aqueous solutions having a pH of at least 8. Solutions of particular benefit are those having a pH in the range of about 9 to 11.5. Any suitable addition agent may be employed to adjust the pH of this rinse solution. Generally, the addition will be selected from the group consisting of the salts of alkali metals, the salts of alkaline earth metals, the hydroxides of the alkali metals, and the hydroxides of the alkaline earth metals. A preferred addition agent is selected from the group consisting of sodium hydroxide, calcium hydroxide, potassium hydroxide, and ammonium hydroxide. While the amount of addition agent present in the solution will be a function of the desired pH level for the solutions, generally, the addition agent will be present in a concentration of greater than 1 ppm.

In accordance with the present invention, it has been found that treating of the foil after the antitarnish treatment with a silane coupling agent results in improved peel strength properties. More specifically, the silane coupling agent may be an organofunctional silane and preferably, the alkoxysilane derivatives. Specific examples of suitable materials include $C_8H_{22}N_2O_3Si$ and $C_9H_{20}SiO_5$.

A more detailed explanation of such silanes appears in the "Handbook of Fillers for Plastics" edited by H. S. Katz and John V. Milewski, Section II, Coupling Agents, Chapter 3 entitled "Organofunctional Silanes" by Sidney E. Berger and Herbert E. Petty published by the Van Nostrand Reinhold Company, 1987. Preferably, the silane is added to the rinse solution, and for this reason the preferred forms of the silane are water soluble.

The silane may be present in the rinse solution in the amount of from about 0.01 to about 50 cc/l (cubic centimeters per liter) and preferably from about 0.25 to about 10 cc/l. The temperature of the rinse may be maintained at a temperature from about 20° C. to about 75° C. and preferably from about 35° C. to about 50° C. The time of immersion of the foil in the solution may vary from about 1 second to 120 seconds, and most preferably for about 5 seconds to about 60 seconds.

After application of the rinse solution containing the silane, the foil strip may then be dried by forced air. The air may be cool, that is at room temperature or heated.

The present invention and the improvements achieved therewith, will be more clearly understood by the following examples in which the peel strengths were all determined in accordance with test IPC-MF-150F, No. 2.4.8:

EXAMPLE A

Electrodeposited copper foil, after being subjected to a dendritic treatment and zinc plating, as described above, was given an antitarnish treatment in $CrO_3/H_3PO_4$ solution having a concentration of 0.2 g/l $CrO_3$ and 0.5 g/l $H_3PO_4$. The foil was treated for 30 seconds at 50-55° C. and was followed by a rinse in an aqueous solution containing 50 ppm $Ca(OH)_2$ at 50° C. for 30 seconds. The initial peel strength was 7 lbs./in. As a comparison, similar foil was rinsed in an aqueous solution containing 50 ppm $Ca(COH)_2$ with 1 cc/l silane ($C_8H_{22}N_2O_3Si$) for a similar time and temperature. In this case, the initial peel strength of the foil was increased to 11 lbs./in. as compared to the 7 lbs./in. of the foil treated without the silane.

EXAMPLE B

Foil similar to that of Example A was treated with an aqueous solution containing 0.2 g/l of $CrO_3$ and 0.05 g/l of H at 50-55° C. for 30 seconds. The foil was then rinsed in a solution containing 50 ppm of $Ca(OH)_2$ plus 1.0 cc/l of silane ($C_8H_{22}N_2O_3Si$) at 50° C. for 30 seconds. It was noted that after three month's storage, the peel strength of the foil rinsed in the solution containing silane was about 2 lbs./inch higher than samples rinsed in a $Ca(OH)_2$ solution without silane.

EXAMPLE C

Electrodeposited copper foil strip similar to Example A was provided with an antitarnish coating by electrodeposition in an electrolyte solution containing 20 grams per liter NaOH, 1 gram per liter ZnO, and 1.0 grams per liter $Na_2Cr_2O_7 \cdot 2H_2O$. Following the electrolytic deposition, the strip was rinsed in distilled water, followed by a rinse in an aqueous solution containing 100 ppm $Ca(OH)_2$. The initial peel strength at the end of one day, exhibited by the foil so produced, was 10.1 lbs./inch. Similar type foil was treated with the same antitarnish treatment except that 1 cc/l silane ($C_8H_{22}N_2O_3SI$) was added to the aqueous rinse containing the $Ca(OH)_2$. In this case, the foil exhibited a peel strength of 10.7 lbs/in.

EXAMPLE D

Electrodeposited copper foil, subject to zinc plating, but without the dendritic treatment was washed and subjected to an antitarnish treatment in a solution $CrO_3/H_2SO_4$ having a concentration of 0.2 g/l $CrO_3$ and 0.05 g/l $H_2SO_4$. This was followed by a rinse in an aqueous solution containing 100 ppm $Ca(OH)_2$. The initial peel strength was 6.2 lbs./in. As a comparison, similar foil treated with the same antitarnish treatment, was rinsed in an aqueous solution containing 100 ppm $Ca(OH)_2$ and 0.5 cc/l of silane ($C_9H_{20}SiO_5$). The initial peel strength of this foil was 7.3 lbs./in.

While the above examples show improvements in peel strength by the use of the silane coupling agent in combination with an antitarnish treatment, the following Example E shows that the use of the silicane coupling agent also provides improvement in peel strength with foil not previously subject to an antitarnish treatment.

EXAMPLE E

Electrodeposited copper foil, subjected to a dendritic treatment and zinc plating, was rinsed in water and dried. The initial peel strength of this foil was 10.1 lbs./in. Similar foil was rinsed in water after the dendritic treatment and zinc plating and then treated with an aqueous solution containing 1 cc/l of silane ($C_8H_{22}N_2O_3Si$) and then dried. The initial peel strength of this foil was 10.8 lbs./in.

Although the preferred method of applying the silane coupling agent in those cases where the foil is provided with an antitarnish treatment followed by a rinse in a basic solution, is by combining it with the basic rinse solution, it can be applied after the rinse treatment as a separate application.

From the examples above, it is seen that the use of the silane coupling agent after the antitarnish treatment results in not only an improvement in the original peel strength of the foil, but also, in a significant improvement in the peel strength properties after storage. Thus, with the use of the present invention, the treated foil will have a longer shelf life than previously possible. Also, the use of the silane coupling agent is effective in cases where there is no antitarnish treatment applied to the initial foil.

It is thus apparent that there has been provided in accordance with this invention a method for treating metal and particularly copper foil which results in a significant improvement in the peel strength of foil, both originally and after storage.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A process for improving the peel strength of a copper and copper alloy material, said process comprising: applying an antitarnish treatment to said material, and rinsing said material in an aqueous rinse solution having a pH greater than about 8, said rinse solution containing a silane coupling agent.

2. The process of claim 1 wherein said silane coupling agent is an organofunctional silane.

3. The process of claim 2 wherein said organofunctional silane is an alkoxysilane derivative.

4. The process of claim 1 wherein the silane coupling agent is selected from the group consisting of $C_8H_{22}N_2O_2Si$ and $C_9H_{20}O_5Si$.

5. The process of claim 1 wherein said antitarnish treatment comprises applying a solution containing chromate to said foil.

6. The process of claim 5 wherein said antitarnish treatment comprises applying a solution of chromic acid-sulfuric acid to said material, said solution having a concentration of chromic acid in the range of about 0.02 g/l to about 5 g/l and a concentration of sulfuric acid in the range of about 0.02 g/l to about 20 g/l.

7. The process of claim 5 wherein said antitarnish treatment comprises applying a dilute aqueous chromic acid-phosphoric acid solution to said material, said solution having a concentration of chromic acid in the range of about 0.02 g/l to about 1 g/l and a concentration of phosphoric acid in the range of about 0.02 g/l to about 1 g/l.

8. The process of claim 1 wherein said antitarnish treatment comprises electrolytically depositing a chromium-zinc coating on said foil.

9. The method of claim 8 wherein said electrolytic deposition is accomplished by immersing said foil strip in an electrolyte containing hydroxide ions, from about 0.07 grams per liter to about 7 grams per liter zinc ions, and from about 0.1 grams per liter to about 100 grams per liter of a water soluble hexavalent chromium salt.

10. The method of claim 1 wherein said material is copper foil having been subjected to a roughening treatment comprising forming a plurality of dendrites on at least one side of the foil.

11. The method of claim 10 wherein said foil has a coating of zinc applied over said roughened surface.

12. A process for improving the peel strength of a copper and copper alloy foil material which has been subjected to an antitarnish coating, said process comprising applying an antitarnish solution to said material, said solution having chromate therein, and thereafter applying a rinse solution containing about 0.01 to about 50 cc/l of a silane coupling agent.

13. The process of claim 12 wherein said rinse solution is an aqueous basic solution having a pH of about greater than 8.

14. The process of claim 13 wherein said rinse solution contains at least 1 ppm of a material selected from the group consisting of the salts of alkali metals, the salts of alkaline earth metals, the hydroxides of the alkali metals, and the hydroxides of the alkaline earth metals.

15. The process of claim 14 wherein said solution contains at least 1 ppm of a material selected from the group consisting of the salts of calcium hydroxide, sodium hydroxide, potassium hydroxide, and ammonium hydroxide.

16. The process of claim 8 wherein said rinse solution is applied by immersing said material in said solution for about 1 to about 120 seconds, while said solution is maintained in a temperature in the range of about 20° to about 75° C.

17. The process of claim 16 wherein said rinse solution contains from about 0.25 to about 10 cc/l of said silane coupling agent.

18. The process of claim 17 wherein said rinse solution is applied for about 5 to about 60 seconds.

19. A process for improving the peel strength of copper and copper alloy foil material which has been subject to an antitarnish coating, said process comprising applying an antitarnish solution to said material, applying a basic rinse solution having a pH greater than about 8, and thereafter applying a solution containing a silane coupling agent.

* * * * *